(12) United States Patent
Kim et al.

(10) Patent No.: US 12,501,772 B2
(45) Date of Patent: *Dec. 16, 2025

(54) DISPLAY PANEL AND DISPLAY DEVICE INCLUDING THE SAME FOR LIGHT TRANSMITTANCE IN LIGHT-TRANSMITTING AREAS AND ENHANCING RELIABILITY OF DISPLAY PANEL

(71) Applicant: LG Display Co., Ltd., Seoul (KR)

(72) Inventors: KaKyung Kim, Paju-si (KR); BaeKeun Yoo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 29 days.

This patent is subject to a terminal disclaimer.

(21) Appl. No.: 18/611,307

(22) Filed: Mar. 20, 2024

(65) Prior Publication Data
US 2024/0237399 A1    Jul. 11, 2024

Related U.S. Application Data

(63) Continuation of application No. 17/532,523, filed on Nov. 22, 2021, now Pat. No. 11,968,857.

(30) Foreign Application Priority Data

Dec. 14, 2020  (KR) .......................... 10-2020-0173956

(51) Int. Cl.
*H10K 59/121* (2023.01)
*H10K 59/65* (2023.01)
*H10K 59/80* (2023.01)

(52) U.S. Cl.
CPC ..... *H10K 59/121* (2023.02); *H10K 59/80521* (2023.02); *H10K 59/80523* (2023.02); *H10K 59/65* (2023.02)

(58) Field of Classification Search
CPC ........... H10K 59/121; H10K 59/80521; H10K 59/80523; H10K 59/65
See application file for complete search history.

(56) References Cited

U.S. PATENT DOCUMENTS 9,105,866 B2    8/2015  Yoon
11,825,677 B2*  11/2023 Liu ...................... H10K 59/353
(Continued)

FOREIGN PATENT DOCUMENTS

CN      110649074 A    1/2020
EP      3 667 654 A1   6/2020
(Continued)

OTHER PUBLICATIONS

U.S. Appl. No. 17/532,523, filed Nov. 22, 2021.

*Primary Examiner* — Mary Ellen Bowman
(74) *Attorney, Agent, or Firm* — Birch, Stewart, Kolasch & Birch, LLP

(57) ABSTRACT

A display panel can include a first area including a plurality of first pixels, and a second area including a pixel area including a plurality of second pixels and a plurality of camera hole areas disposed between the plurality of second pixels, in which each of the plurality of first pixels and the plurality of second pixels includes a light emitting element, and the light emitting element includes an anode layer and a cathode layer. Also, the cathode layer disposed in the second area includes openings, a density of the first pixels is different from a density of the second pixels, and metal electrode materials are surrounding the openings of the cathode layer in the second area and electrically connected to a pixel group in at least one of the plurality of camera hole areas.

21 Claims, 15 Drawing Sheets

(56) References Cited

U.S. PATENT DOCUMENTS

| | | | | |
|---|---|---|---|---|
| 2020/0411605 A1* | 12/2020 | Moon | .................. | H10K 59/126 |
| 2021/0091147 A1* | 3/2021 | Liu | .................. | H10K 59/80517 |
| 2021/0193769 A1* | 6/2021 | Bok | ....................... | H10K 59/60 |
| 2022/0149318 A1* | 5/2022 | Kim | .................. | H10K 59/8052 |
| 2022/0190050 A1* | 6/2022 | Kim | ................. | H10K 59/80523 |

FOREIGN PATENT DOCUMENTS

| | | |
|---|---|---|
| KR | 10-2009-0111082 A | 10/2009 |
| KR | 10-2014-0085979 A | 7/2014 |
| KR | 10-2016-0062661 A | 6/2016 |
| KR | 10-2017-0002719 A | 1/2017 |
| KR | 10-2020-0097871 A | 8/2020 |

\* cited by examiner 14-3 (14-31, 14-32, 14-33)

14-3 (14-31, 14-32, 14-33)

DISPLAY PANEL AND DISPLAY DEVICE INCLUDING THE SAME FOR LIGHT TRANSMITTANCE IN LIGHT-TRANSMITTING AREAS AND ENHANCING RELIABILITY OF DISPLAY PANEL

CROSS-REFERENCE TO RELATED APPLICATION

This application is a Continuation Application of U.S. application Ser. No. 17/532,523, filed on Nov. 22, 2021, which claims priority to Korean Patent Application No. 10-2020-0173956, filed on Dec. 14, 2020 in the Republic of Korea, the entire contents of all these applications being incorporated by reference into the present application.

BACKGROUND

Technical Field

The present disclosure relates to a display panel including areas with different resolutions from each other, and a display device including the display panel.

Description of Related Art

Electroluminescent display devices are generally classified into inorganic light emitting display devices and organic light emitting display devices according to a material of an emission layer.

Organic light emitting display devices of an active matrix type include an organic light emitting diode with a self-emitting property, and have an advantage of a short response time, high luminous efficiency, excellent luminance, a wide viewing angle, and the like. In the organic light emitting display devices, organic light emitting diodes are disposed in each pixel thereof. The organic light emitting display devices have characteristics of not only a short response time, excellent luminous efficiency, high luminance, and a wide viewing angle, but high contrast ratio and excellent color gamut because black in the range of gray levels can be expressed as complete black.

In modern society, mobile terminals are widely used, and multimedia functions for implementing various functions or applications used in daily life through mobile terminals are becoming increasingly improved. For example, a camera is embedded into a smart phone by default, and recently, there has been a trend toward a camera with resolution close to the resolution of a conventional digital camera. However, a front camera of the smart phone can limit the size and design of the screen and thus, this can make it difficult to design the screen wider and more freely. In order to reduce a corresponding space occupied by the camera, a screen design including a notch or punch hole has been adopted in some smart phones. However, in these implementations, the screen size can be still limited due to the camera, and thus, there is a need for implementing a full-screen display. The full-screen display refers to a display device or a display technique in which an image is enabled to be displayed on most of the front surface of mobile terminals such as smart phones.

To implement the full-screen display, there is provided a scheme of assigning an imaging area in which low-resolution pixels are disposed in a screen of a display panel and arranging a camera and/or various sensors in a location or area opposite to the imaging area under the display panel.

However, although having low-resolution, the pixels are disposed in the imaging area, thus, this results in a problem that light transmittance is relatively lowered, and the performance of the camera and/or such sensors is deteriorated.

SUMMARY OF THE DISCLOSURE

To address these issues, embodiments of the present specification provide display panels capable of improving light transmittance of an imaging area, and display devices including the display panel.

Embodiments of the present specification provide display panels capable of improving reliability thereof by improving characteristics of an encapsulation layer of an imaging area, and display devices including the display panel.

Issues or needs being addressed by the features of the present disclosure are not limited thereto, and other issues or needs will become apparent to those skilled in the art from the following description.

According to aspects of the present disclosure, a display panel is provided that includes a first area including a plurality of first pixels, and a second area including a pixel area including a plurality of second pixels and a plurality of light-transmitting areas disposed between the plurality of second pixels. Each of the plurality of first pixels and the plurality of second pixels includes a light emitting element, such as a light emitting diode, or the like, and the light emitting element includes an anode layer and a plurality of cathode layers. The plurality of cathode layers disposed in the second area can be disposed in areas except for the light-transmitting areas. Thus, according to embodiments of the present disclosure, the display panel provides an advantage of improving light transmittance in the light-transmitting areas and enhancing the reliability of the display panel.

According to aspects of the present disclosure, a display device is provided that includes a display panel a first area including a plurality of first pixels, a pixel area including a plurality of second pixels, and a second area including a plurality of light-transmitting areas disposed between the plurality of second pixels, and at least one sensor disposed under the second area. A light emitting element, such as a light emitting diode, or the like, that is included in each of the plurality of first pixels and the plurality of second pixels includes an anode layer and a plurality of cathode layers, and the plurality of cathode layers is disposed in areas except for the light-transmitting areas. Thus, according to embodiments of the present disclosure, the display device provides an advantage of improving light transmittance in the light-transmitting areas and enhancing the reliability of the display device.

Various specific features, configurations, techniques and processes are included in detailed description and the accompanying drawings, and will be discussed in detail below.

According to embodiments of the present disclosure, it is possible to improve light transmittance in an imaging area by forming light-transmitting areas by patterning a cathode in the display panel.

According to embodiments of the present disclosure, it is possible to improve light transmittance in an imaging area and the reliability of the display panel by disposing a plurality of cathodes resulting from dividing a patterned cathode in the display panel.

According to embodiments of the present disclosure, by disposing a plurality of cathodes to overlap one another in a display area of the display panel, it is possible to reduce resistance due to the cathodes and stabilize voltages supplied to the cathodes.

Issues required to be addressed, embodiments for addressing the issues, effects resulting from the embodiments, which are described above and below, are not intended to specify essential features of claims, and thus, the claims are not intended to be limited to the particular features described in the present disclosure.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure. In the drawings.

DETAILED DESCRIPTION OF THE EMBODIMENTS

Figure 1:
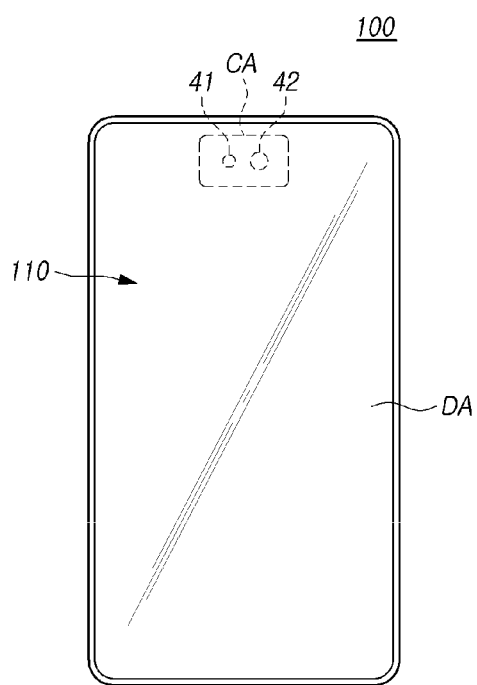
FIG. 1 illustrates schematically a display device according to aspects of the present disclosure.

The advantages and features of the present disclosure and methods of achieving the same will be apparent by referring to embodiments of the present disclosure as described below in detail in conjunction with the accompanying drawings. However, the present disclosure is not limited to the embodiments set forth below, but can be implemented in various different forms. The following embodiments are provided only to completely disclose the present disclosure and inform those skilled in the art of the scope of the present disclosure, and the present disclosure is defined only by the scope of the appended claims.

In addition, the shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description can make the subject matter in some embodiments of the present disclosure rather unclear. The terms such as "including", "having", "containing", "comprising of", and "consist of" used herein are generally intended to allow other components to be added unless the terms are used with the term "only". Singular forms used herein are intended to include plural forms unless the context clearly indicates otherwise.

In interpreting any elements or features of the embodiments of the present disclosure, it should be considered that any dimensions and relative sizes of layers, areas and regions include a tolerance or error range even when a specific description is not conducted.

Spatially relative terms, such as, "on", "over", "above", "below", "under", "beneath", "lower", "upper", "near", "close", "adjacent", and the like, can be used herein to describe one element or feature's relationship to another element(s) or feature(s) as illustrated in the figures, and it should be interpreted that one or more elements can be further "interposed" between the elements unless the terms such as 'directly', "only" are used.

Time relative terms, such as "after", "subsequent to", "next to", "before", or the like, used herein to describe a temporal relationship between events, operations, or the like are generally intended to include events, situations, cases, operations, or the like that do not occur consecutively unless the terms, such as "directly", "immediately", or the like, are used.

The elements or features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

Hereinafter, a pixel driving circuit and an electroluminescent display device using the pixel driving circuit according to embodiments of the present disclosure will be described with reference to the accompanying drawings.

Figure 3:
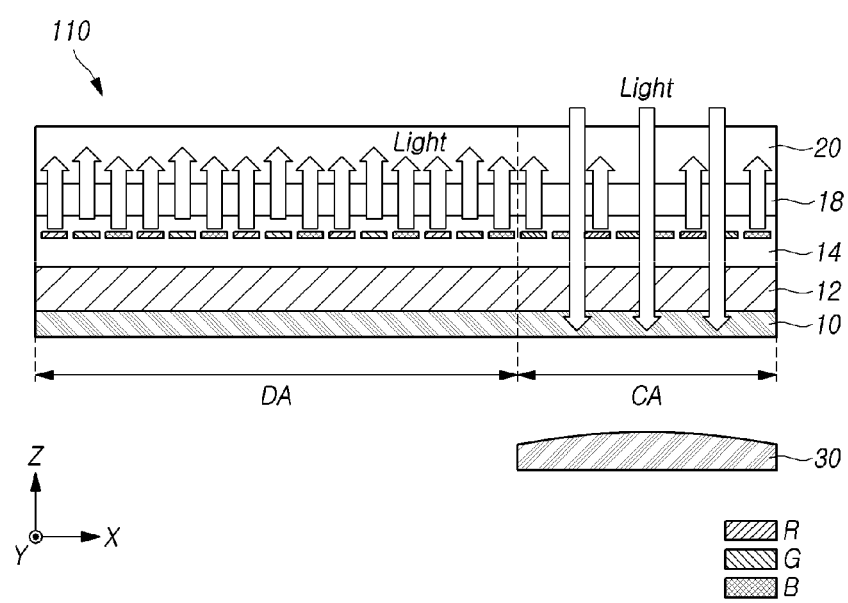
FIG. 3 illustrates schematically a display panel according to aspects of the present disclosure.
Figure 4:
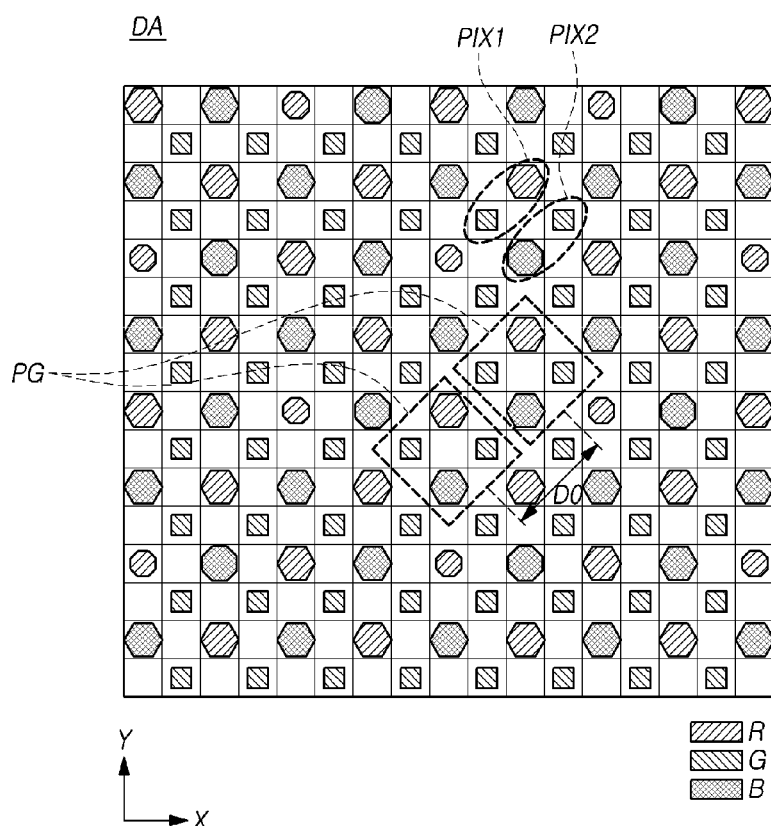
FIG. 4 illustrates an example arrangement of pixels disposed in a display area of the display panel according to aspects of the present disclosure.

FIG. 1 illustrates conceptually a display device 100 according to aspects of the present disclosure. FIGS. 2A to 2D illustrates various arrangements and shapes of an imaging area. FIG. 3 illustrates schematically a display panel 110 according to aspects of the present disclosure. FIG. 4 illustrates an example arrangement of the pixels PIX disposed in a display area DA of the display panel 110 according to aspects of the present disclosure. All the components of each display device according to all embodiments of the present disclosure are operatively coupled and configured.

Referring to FIG. 1, the display device 100 can include the display panel 110 and a case, and a display area can be configured in the front surface of the display panel 110. Accordingly, a full-screen display can be enabled.

The display area can include a first area DA and a second area CA. In such a display device, both the first area DA and the second area CA can present images, but can have different resolutions from each other. For example, the resolution of a plurality of second pixels disposed in the second area CA can be lower than the resolution of a plurality of first pixels disposed in the first area DA. A sufficient amount of light corresponding to a degree to which the resolution of the plurality of second pixels disposed in the second area CA is lowered can be allowed to enter one or more sensors (41, 42) disposed in the second area CA.

However, embodiments of the present disclosure are not limited thereto. For example, if the second area CA has sufficient light transmittance, or a suitable noise compensation algorithm is implemented, the resolution of the second area CA can be substantially equal to the resolution of the first area DA. For the purpose of description, discussions are conducted on a case in which the resolution of the second area CA of the display panel 110 according to aspects of the present disclosure is lower than that of the first area DA.

The second area CA included in the display panel 110 according to aspects of the present disclosure can be an area in which one or more sensors (41, 42) are disposed. The second area CA can be an area overlapping one or more sensors. Therefore, the second area CA can have a size smaller than the first area DA in which most images are displayed.

The sensor (41, 42) can include at least one of an image sensor, a proximity sensor, an illuminance sensor, a gesture sensor, a motion sensor, a fingerprint recognition sensor, and a biometric sensor. For example, the one or more sensors (41, 42) disposed in the second area CA can include a first sensor 41 such as an illuminance sensor, and a second sensor 42 such as an image sensor for capturing images or videos. However, embodiments of the present disclosure are not limited thereto.

Figure 2A:
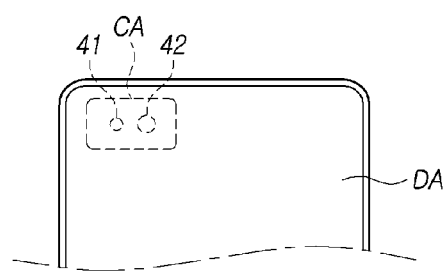
FIGS. 2A to 2D illustrate various arrangements and shapes of an imaging area in the display device according to aspects of the present disclosure.
Figure 2B:
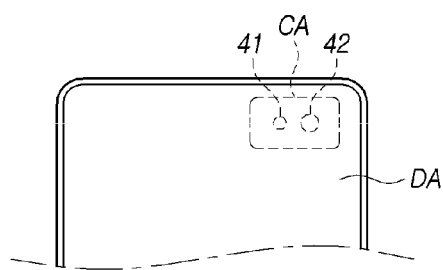
Figure 2C:
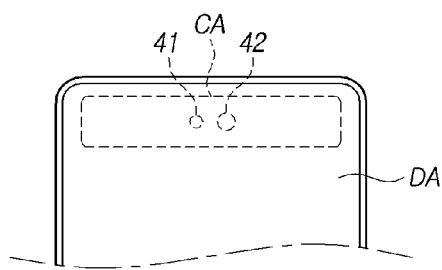
Figure 2D:
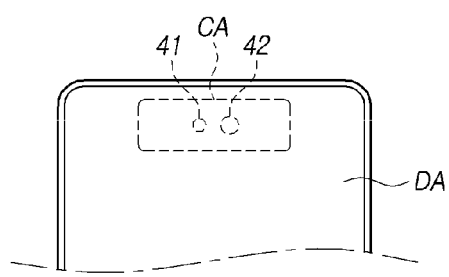

Referring to FIGS. 2A to 2D, the second area CA can be disposed at various locations where light is required to be incident. For example, as shown in FIG. 2A, the second area CA can be disposed on the upper left of a display area in which an image is displayed, or as shown in FIG. 2B, the second area CA can be disposed on the upper right of the display area. Further, as shown in FIG. 2C, the second area CA can be entirely disposed in an upper edge of the display area, or as shown in FIG. 2D, the second area CA can be disposed in a part of the upper edge of the display area. However, embodiments of the present disclosure are not limited thereto. For example, the second area CA can be placed in a central area, a lower edge, or a side area of the display area, or on a side surface of the display device.

Hereinafter, the first area DA can be referred to as a display area, and the second area CA can be referred to as an imaging area.

Referring to FIGS. 3 and 4, the display area DA and the imaging area CA can include a pixel array formed by arranging a plurality of pixels emitting light according to pixel data. The plurality of first pixels or the plurality of second pixels described above can each be referred to as such a pixel array. Further, the resolution is typically defined by pixels per inch (PPI), and pixels per unit area of the imaging area CA can be lower than pixels per unit area of the display area DA in order to ensure the light transmittance of the imaging area CA.

The pixel array of the display area DA can be formed by arranging a relatively large number of pixels per unit area. An area including a plurality of first pixels in the display area DA and formed by arranging a relatively large number of the first pixels per unit area can be referred to as a first pixel area.

In contrast, the array of pixels of the imaging area CA can be formed by arranging a relatively small number of pixels per unit area as the pixels are needed to be spaced apart from one another by light-transmitting areas. An area including a plurality of second pixels in the imaging area CA and formed by arranging a relatively small number of second pixels per unit area can be referred to as a second pixel area. In the imaging area CA, external light can pass through the display panel 110 through at least one light-transmitting area having a high light transmittance, and enter a sensor located under the display panel 110.

Since both the display area DA and the imaging area CA include pixels, input images can be presented in both the display area DA and the imaging area CA.

Each of pixels in the display area DA and the imaging area CA can include sub-pixels having different colors to implement images with colors. The sub-pixels can include a red sub-pixel R, a green sub-pixel G, and a blue sub-pixel B. Although the sub-pixels can further include a white sub-pixel, FIGS. 3 and 4 illustrate sub-pixels including the red sub-pixel R, the green sub-pixel G, and the blue sub-pixel B. Further, each sub-pixel can include a pixel circuit and a light emitting element, such as a light emitting diode, more specifically, an organic light emitting diode (OLED).

The imaging area CA can include pixels, and at least one sensor disposed under the screen of the display panel 110. The sensor can include various types of sensors as described above, and hereinafter, a camera module is described as an example of the sensor disposed on the display device 100 according to aspects of the present disclosure. As pixel data of input images are written to the pixels disposed in the imaging area CA in a display mode, corresponding images can be presented in the imaging area CA.

The camera module can capture external images in an imaging mode and output photo or video data. A lens of the camera module can be disposed to face the imaging area CA. The external light can travel onto the lens of the camera module through the imaging area CA, and the lens 30 can condense the light to an associated image sensor. The camera module can capture external images in the imaging mode and output photo or video data.

As the number of pixels per unit area in the pixel array of the imaging area CA is relatively low, to achieve high light transmittance, an image quality compensation algorithm can be applied to compensate for luminance and color coordinates of pixels in the imaging area CA. Therefore, a full screen display can be implemented without a limitation on the use of the display area of the display panel 110 due to the camera module.

The display panel has a width in an X-axis direction, a length in a Y-axis direction, and a thickness in a Z-axis direction. The display panel 110 can include a circuit layer 12 disposed on a substrate 10 and a light emitting element layer 14 disposed on the circuit layer 12. An encapsulation layer 18 can be disposed on the light emitting element layer 14, and a cover glass 20 can be disposed on the encapsulation layer 18. In some embodiments, a polarizing plate can be disposed between the encapsulation layer 18 and the cover glass 20 to improve visibility of the display device 100 in bright environments.

The circuit layer 12 can include a pixel circuit connected to lines, such as data lines, gate lines, power lines, and the like, and a gate driver connected to the gate lines. The circuit layer 12 can include circuit elements such as a transistor (e.g., a thin film transistor (TFT)), a capacitor, and the like, and lines. The lines and circuit elements of the circuit layer 12 can be implemented or formed using a plurality of insulating layers, two or more metal layers separated by an insulating layer interposed therebetween, and an active layer including a semiconductor material.

The light emitting element layer 14 can include a light emitting element driven by the pixel circuit. For example, an organic light emitting diode OLED can be employed as the light emitting element. The organic light emitting diode OLED can include an organic compound layer formed between an anode and a cathode. The organic compound layer can include a hole injection layer (HIL), a hole transport layer (HTL), an emission layer (EML), an electron transport layer (ETL), and an electron injection layer (EIL); however, embodiments of the present disclosure are not limited thereto. The remaining layers except for the emission layer among the layers included in the organic compound layers can be commonly stacked in pixels, and thus referred to as common layers. When a voltage is applied to the anode and cathode of the organic light emitting diode, holes passing through the hole transport layer and electrons passing through the electron transport layer can move to the emission layer, and then form excitons. Thereby, visible light can be emitted from the emission layer. The light emitting element layer 14 is disposed over pixels that selectively transmit red, green, and blue wavelengths. In some embodiments, a color filter array can be disposed in a direction through which light from the light emitting element layer 14 is emitted.

The light emitting element layer 14 can be covered by the encapsulation layer 18. The encapsulation layer 18 can have a structure in which at least one organic film and at least one inorganic film are alternately stacked. The inorganic film can serve to block the penetration of moisture or oxygen, and the organic film can serve to flatten a surface of the inorganic film. As a traveling path of moisture or oxygen in the stacking structure of one or more organic films and one or more inorganic films becomes longer than that in a structure having a single layer, therefore, such an encapsulation layer 18 can effectively prevent the penetration of moisture and oxygen affecting the light emitting element layer 14.

Referring to FIG. 4, pixels PIX1 and PIX2 can be arranged in a matrix form in the display area DA. Each of the pixels PIX1 and PIX2 can form one unit pixel by including a plurality of sub-pixels among a red sub-pixel R, a green sub-pixel G, and a blue sub-pixel B.

Each of the pixels PIX1 and PIX2 can further include a white sub-pixel. Further, two sub-pixels can form one pixel using a sub-pixel rendering algorithm. For example, a first pixel PIX1 includes the red sub-pixel R and the green sub-pixel G, and a second pixel PIX2 includes the blue sub-pixel B and the green sub-pixel G. An average value of corresponding color data of neighboring pixels through the sub-pixel rendering algorithm can be used to compensate for the insufficient color representation in each of the pixels PIX1 and PIX2. When a pixel group PG including the first pixel PIX1 and the second pixel PIX2 is defined, pixel groups PG spaced apart by a predetermined distance D0 can be disposed in the display area DA.

Although FIG. 4 illustrates that the sub-pixels are arranged such that the red sub-pixel R, the green sub-pixel G, the blue sub-pixel B, and the green sub-pixel G are arranged in a zigzag pattern in the X-axis direction; embodiments of the present disclosure are not limited thereto.

Figure 5A:
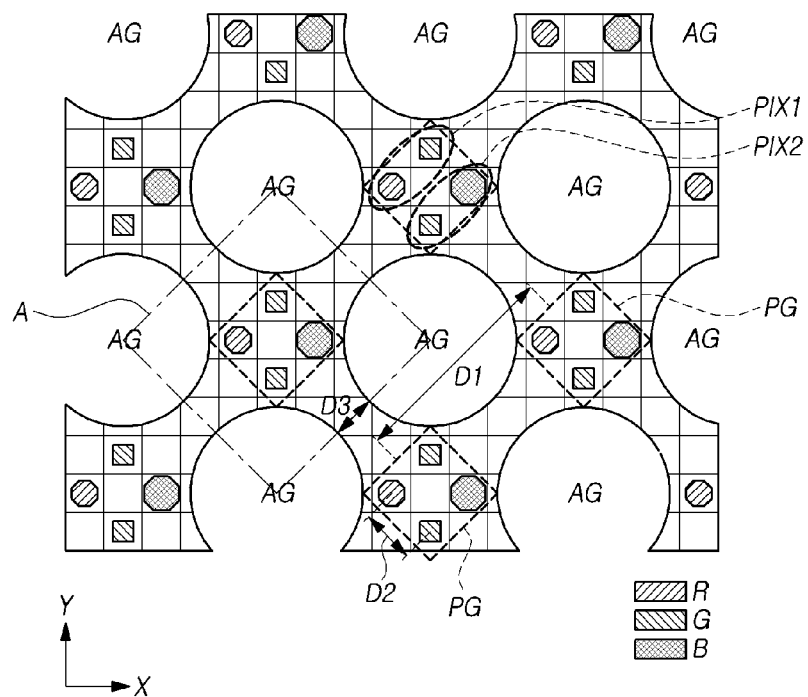
FIG. 5A illustrates pixels and light-transmitting areas in an imaging area of the display panel according to aspects of the present disclosure.
Figure 5B:
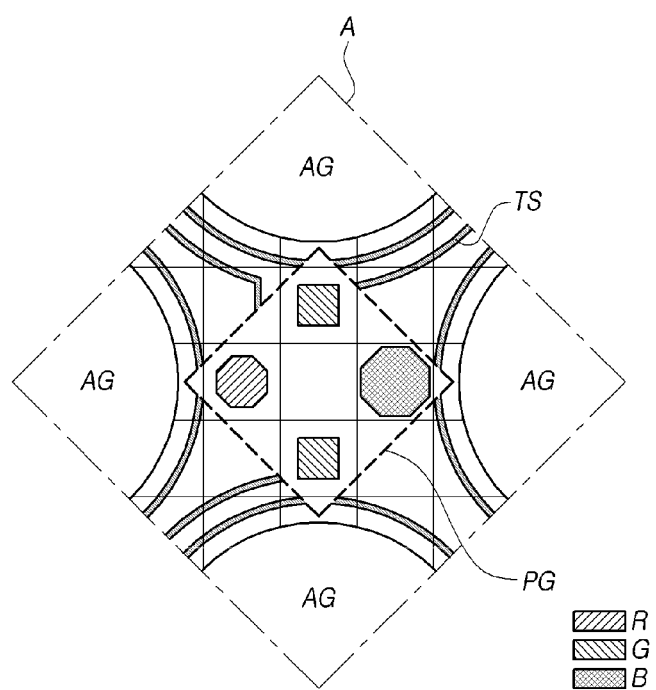
FIG. 5B is an enlargement of part A of FIG. 5A.

FIG. 5A illustrates pixels and light-transmitting areas AG of the imaging area CA in the display panel 110 according to aspects of the present disclosure. FIG. 5B is an enlargement of part A of FIG. 5A.

Referring to FIGS. 5A and 5B, a plurality of light-transmitting areas AG can present in the imaging area CA. The plurality of light-transmitting areas AG can be disposed between the plurality of second pixels. Specifically, the imaging area CA can include one or more pixel groups PG spaced apart by a predetermined distance D1 from one another and one or more light-transmitting areas AG disposed between adjacent pixel groups PG. External light can be allowed to travel onto the lens of the camera module through the light-transmitting area AG. The pixel groups PG can each include a first pixel PIX1 and a second pixel PIX2 and can be disposed to be spaced apart from one another in the second pixel area. In this situation, a distance D1 by which pixel groups PG are spaced apart from one another in the imaging area CA can be larger than a distance D0 by which pixel groups PG are spaced apart from one another in the display area DA. Although FIG. 5A illustrates that the distance D1 at which the pixel groups PGs are spaced apart from one another in the imaging area CA is double the distance D0 at which the pixel groups PGs are spaced apart from one another in the display area DA, however, embodiments of the present disclosure are not limited thereto.

The light-transmitting area AG can include one or more transparent materials having high light transmittance without including a metal material for allowing light to enter the light-transmitting area AG with a minimized or reduced loss. In some embodiments, the light-transmitting area AG can include transparent insulating materials without including metal lines or pixels. The light transmittance of the imaging area CA can increase as the light-transmitting area AG becomes larger.

Each pixel group PG can include one or two pixels. Further, each of the pixels included in the pixel group PG can include two to four sub-pixels. For example, one pixel in the pixel group PG can include a red sub-pixel R, a green sub-pixel G, and a blue sub-pixel B, or include two sub-pixels among these sub-pixels, and in some embodiments, further include a white sub-pixel.

A distance D3 between the light-transmitting areas AG can be smaller than a distance D1 between the pixel groups PG. A distance D2 between the sub-pixels can be smaller than the distance D1 between the pixel groups PG.

FIGS. 5A and 5B illustrate that a shape of the light-transmitting area AG is circular; however, embodiments of the present disclosure are not limited thereto. For example, the light-transmitting area AG can be designed in various shapes such as a circle, an ellipse, a polygon, and the like.

Referring to FIG. 5B, all metal electrode materials can be removed from the light-transmitting area AG. For example, metal electrode materials may not be disposed in the light-transmitting area AG. To do this, lines TS of pixels can be disposed outside of the light-transmitting area AG. Accordingly, light can effectively pass through the light transmitting area AG. However, embodiments herein are not limited thereto; for example, a metal electrode material can remain in a partial area of the light-transmitting area AG.

Figure 6A:
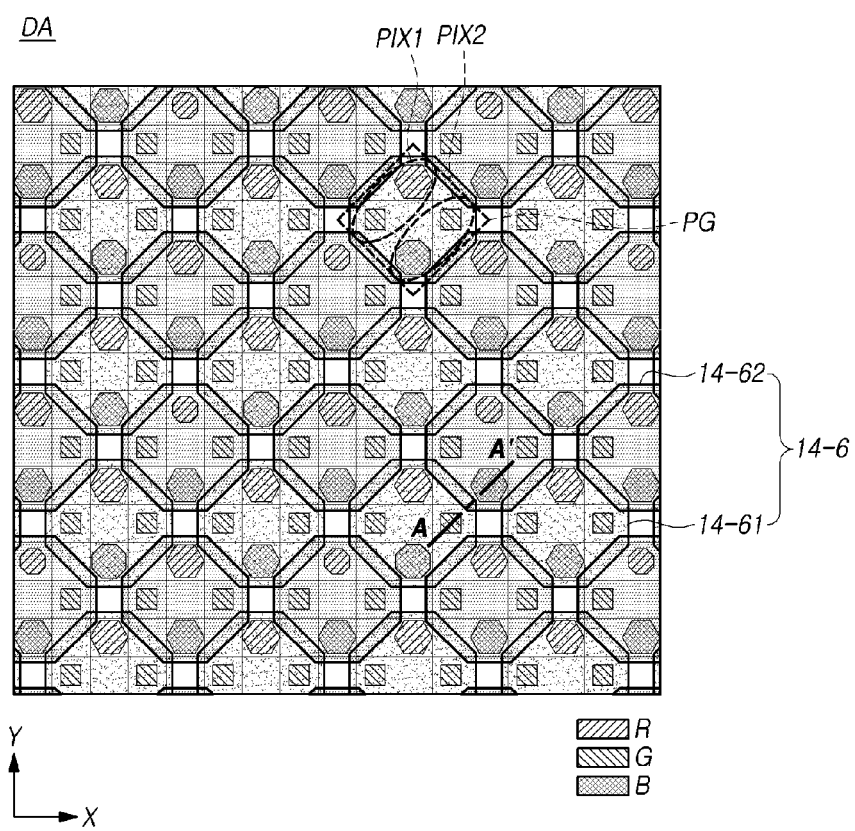
FIG. 6A illustrates an example arrangement of pixels and metal layers in the display area of the display panel according to aspects of the present disclosure.
Figure 6B:
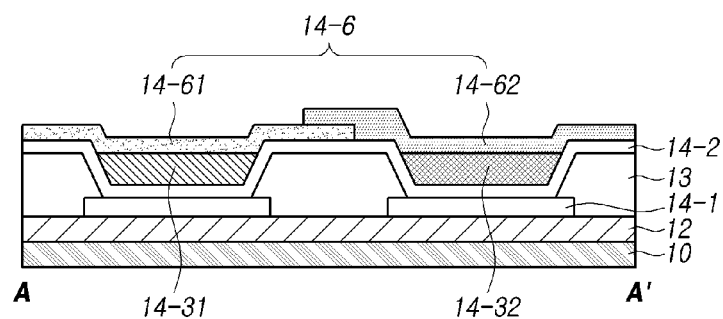
FIG. 6B is a cross-sectional view taken along with line A-A' of FIG. 6A.

FIG. 6A illustrates an example arrangement of pixels and metal layers in the display area DA of the display panel 110 according to aspects of the present disclosure. FIG. 6B is a cross-sectional view taken along with line A-A' of FIG. 6A. For convenience of description, discussions on configurations of FIGS. 6A and 6B substantially, or nearly, equal to the configurations of FIGS. 3 and 4 are not given repeatedly.

Referring to FIGS. 6A and 6B, a metal layer can be disposed in each pixel group PG including a first pixel PIX1 and a second pixel PIX2 disposed in the display area DA. For example, the metal layer can be a layer included in the light emitting element layer 14 and making it difficult for light to transmit. In some embodiments, a cathode will be described as an example of the metal layer.

A cathode disposed on the display panel 110 according to aspects of the present disclosure can be implemented in the form of two cathode layers. The cathode can include a first cathode layer 14-61 and a second cathode layer 14-62, and each of the first cathode layer 14-61 and the second cathode layer 14-62 can be patterned. The first cathode layer 14-61 and the second cathode layer 14-62 can have a size that allows a corresponding pixel group PG to be covered, and have a changed size or shape according to a shape of pixel group PG.

In one embodiment, first cathode layers 14-61 and second cathode layers 14-62 disposed on the display panel 110 can be disposed to be spaced apart on a pixel group (PG) basis and; however, embodiments of the present disclosure are not limited thereto. First cathode layers 14-61 and second cathode layers 14-62 can be disposed to be spaced apart on a first pixel (PIX1) basis and on a second pixel (PIX2) basis, respectively, or be disposed to be spaced apart on a sub-pixel basis.

In one embodiment, each of the first cathode layer 14-61 and the second cathode layer 14-62 can have an octagonal shape; however, embodiments of the present disclosure are not limited thereto. The first cathode layer 14-61 and the second cathode layer 14-62 can have an equal shape, such as a circle, a polygon, or the like.

The first cathode layers 14-61 may not overlap one another. Likewise, the second cathode layers 14-62 may not overlap one another. One of the first cathode layer 14-61 and the second cathode layer 14-62 can be arranged in an X-axis direction, and the other thereof can be arranged in a Y-axis direction. Further, as the first cathode layer 14-61 and the second cathode are alternately arranged in a diagonal direction, the first cathode layers 14-61 can be disposed in a diagonal direction of the second cathode layers 14-62, and the second cathode layers 14-62 can be disposed in a diagonal direction of the first cathode layers 14-61. A first cathode layer 14-61 and a second cathode layer 14-62 located adjacent to each other can be disposed to overlap each other, and thereby, electrically connected to each other.

FIG. 6B shows the cross-section of a green sub-pixel G and a blue sub-pixel B in the display area DA. As described above, the light emitting element layer 14 can include an anode, an emission layer, a cathode, and a common layer. FIG. 6B illustrates an example light emitting element layer 14 including an anode layer 14-1, a common layer 14-2, an emission layer 14-3, and a cathode layer 14-6.

A circuit layer 12 can be disposed on a substrate 10, and the anode layer 14-1 can be disposed on the circuit layer 12. Anode layers 14-1 can be disposed to be spaced apart from on a sub-pixel basis. On the anode layer 14-1, a bank layer 13 can be disposed to cover an edge of the anode layer 14-1 for allowing most of the anode layer 14-1 to be exposed, and thereby, serve to separate sub-pixels.

The common layer 14-2 can be disposed on the anode layer 14-1 exposed by the bank layer 13 and the bank layer 13. The common layer 14-2 can include a hole injection layer and a hole transport layer; however, embodiments of the present disclosure are not limited thereto.

The emission layer 14-3 can be disposed on the common layer. A green emission layer 14-31 can be disposed in the green sub-pixel G, and a blue emission layer 14-32 can be disposed in the blue sub-pixel B. A first cathode layer 14-61 can be disposed on the green emission layer 14-31, and a second cathode layer 14-62 can be disposed on the blue emission layer 14-32. Another common layer can be disposed between the green emission layer 14-31 and the first cathode layer 14-61 and between the blue emission layer 14-32 and the second cathode layer 14-62.

Each of the first cathode layer 14-61 and the second cathode layer 14-62 for implementing the cathode can be formed in a single layer or multiple layers, or formed of an alloy of metal materials. The cathode can be formed of a metal material such as aluminum (Al), silver (Ag), magnesium (Mg), ytterbium (Yb), indium tin oxide (ITO), or the like. The first cathode layer 14-61 and the second cathode layer 14-62 can be formed of one or more equal materials, and thereby, have equal resistance and conductivity.

The first cathode layer 14-61 and the second cathode layer 14-62 can overlap in a non-light emitting area to be electrically conducted. In this case, the non-light emitting area can correspond to an area in which the anode layer 14-1 is not disposed.

Figure 7A:
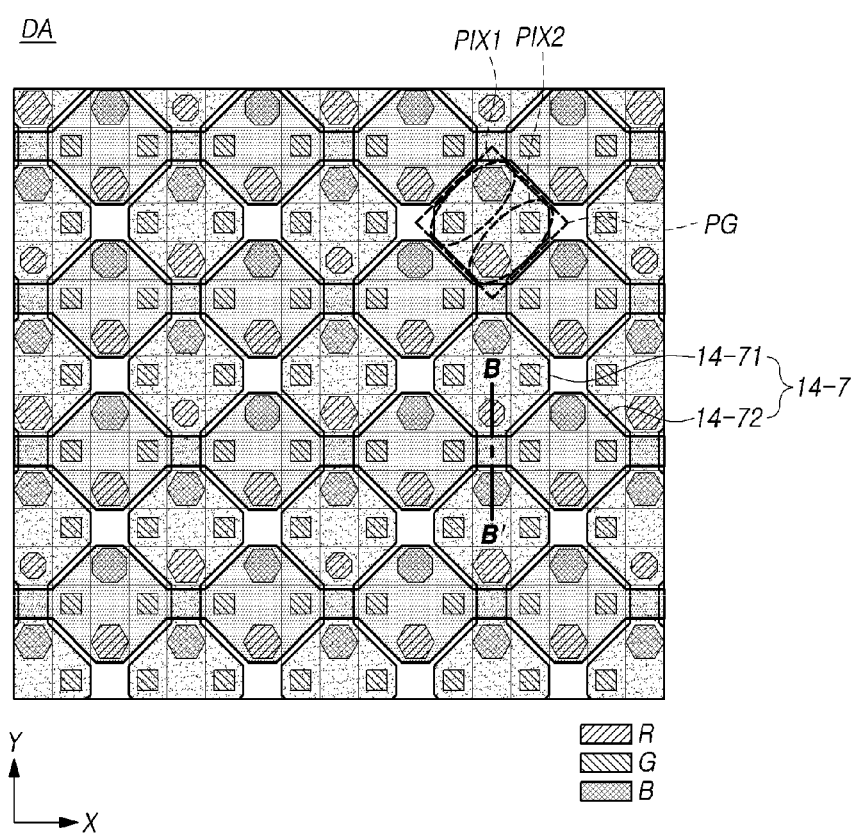
FIG. 7A illustrates an example arrangement of pixels and metal layers in the display area of the display panel according to aspects of the present disclosure.
Figure 7B:
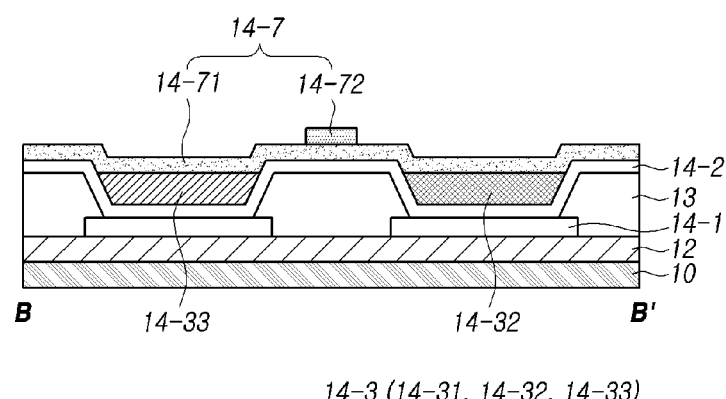
FIG. 7B is a cross-sectional view taken along with line B-B' of FIG. 7A.

FIG. 7A illustrates an example arrangement of pixels and metal layers in the display area DA of the display panel 110 according to aspects of the present disclosure. FIG. 7B is a cross-sectional view taken along with line B-B' of FIG. 7A. FIGS. 7A and 7B can result from modifying some configurations of FIGS. 6A and 6B, respectively, and therefore, for convenience of description, discussions on configurations of FIGS. 7A and 7B substantially, or nearly, equal to the configurations of FIGS. 6A and 6B are not given repeatedly.

Referring to FIGS. 7A and 7B, a cathode layer 14-7 can be disposed in each pixel group PG including the first pixel PIX1 and the second pixel PIX2 disposed in the display area DA.

In an embodiment, each first cathode layer 14-71 and each second cathode layer 14-72 disposed in the display panel 110 can be patterned.

In this embodiment, first cathode layers 14-71 disposed in the display panel 110 can be implemented by patterning in a form where the first cathode layers 14-61 arranged in the Y-axis direction among the first cathode layers 14-61 illustrated in FIG. 6A are connected to one another.

Likewise, second cathode layers 14-72 disposed in the display panel 110 can be implemented by patterning in a form where the second cathode layers 14-62 arranged in the X-axis direction among the second cathode layers 14-62 illustrated in FIG. 6A are connected to one another. The first cathode layer 14-71 and the second cathode layer 14-72 can be disposed to overlap in an area intersecting each other, and thereby, electrically connected to each other.

Although the first cathode layers 14-71 have a structure in which they are connected in the Y-axis direction. and the second cathode layer 14-72 have a structure in which they are connected in the X-axis direction, it can be considered to have substantially the same structure because they can be formed using the same mask.

Each of the first cathode layer 14-71 and the second cathode layer 14-72 for implementing the cathode can be formed in a single layer or multiple layers, or formed of an alloy of metal materials. The cathode can be formed of a metal material such as aluminum (Al), silver (Ag), magnesium (Mg), ytterbium (Yb), indium tin oxide (ITO), or the like. The first cathode layer 14-71 and the second cathode layer 14-72 can be formed of one or more equal materials, and thereby, have equal resistance and conductivity.

FIG. 7B illustrates the cross-section of a red sub-pixel R and a blue sub-pixel B. As described above, an example light emitting element layer 14 can include the anode layer 14-1, the common layer 14-2, the emission layer 14-3, and the cathode layer 14-7.

The circuit layer 12 can be disposed on the substrate 10, and the anode layer 14-1 can be disposed on the circuit layer 12. Anode layers 14-1 can be disposed to be spaced apart on a sub-pixel basis. On the anode layer 14-1, the bank layer 13 can be disposed to cover an edge of the anode layer 14-1 for allowing most of the anode layer 14-1 to be exposed, and thereby, serve to separate sub-pixels.

The common layer 14-2 can be disposed on the anode layer 14-1 exposed by the bank layer 13 and the bank layer 13. The common layer 14-2 can include a hole injection layer and a hole transport layer; however, embodiments of the present disclosure are not limited thereto.

The emission layer 14-3 can be disposed on the common layer 14-2. A red emission layer 14-33 can be disposed in the red sub-pixel R, and a blue emission layer 14-32 can be disposed in the blue sub-pixel B. A first cathode layer 14-71 can be disposed on the red emission layer 14-33 and the blue emission layer 14-32, and a second cathode layer 14-72 can be disposed on the first cathode layer 14-71. Specifically, the second cathode layer 14-72 can be disposed between the red emission layer 14-33 and the blue emission layer 14-32. The first cathode layer 14-71 and the second cathode layer 14-72 can overlap in a non-light emitting area to be electrically conducted. In this case, the non-light emitting area can correspond to an area in which the anode layer 14-1 is not disposed.

In some embodiments, the first cathode layers 14-61 and 14-71 and the second cathode layers 14-62 and 14-72 disposed in the display area DA can be implemented in variously forms without being limited to the above-mentioned shapes. For example, the first cathode layer can be disposed in the form of a wide flat plate in the display area DA, and the second cathode layer can be patterned and overlap on or over the first cathode layer. In this case, the shape of the second cathode layer can be implemented in various forms, and disposed in the same shape and pattern as a second cathode layer disposed in the imaging area CA to be described in FIG. 8A. Accordingly, as the cathode includes the first cathode layer and the second cathode layer overlapping each other, the resistance of the cathode can be reduced, and the voltage provided through the cathode can be stabilized.

Figure 8A:
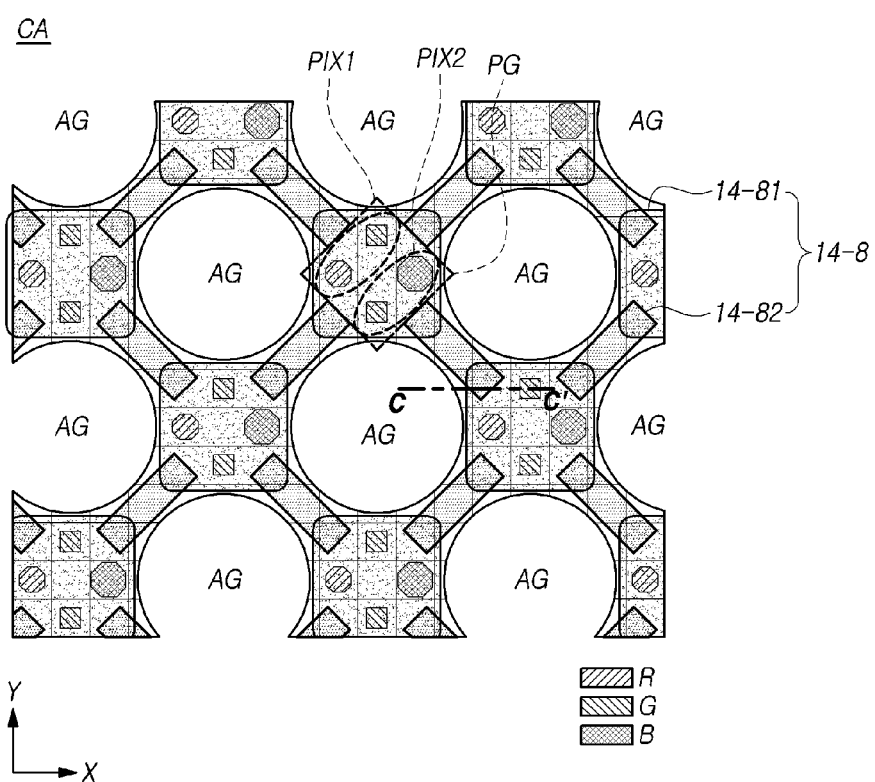
FIG. 8A illustrates an example arrangement of pixels and metal layers in the imaging area of the display panel according to aspects of the present disclosure.
Figure 8B:
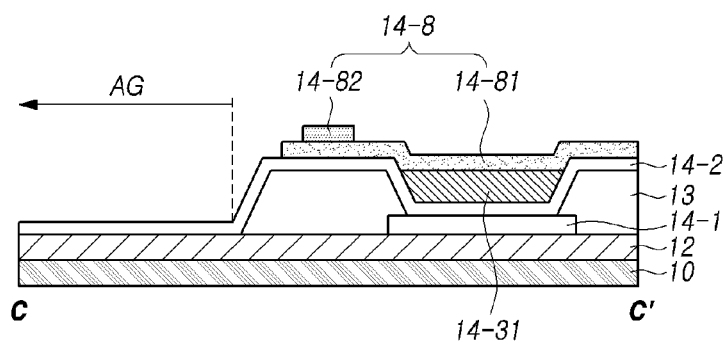
FIG. 8B is a cross-sectional view taken along with line C-C' of FIG. 8A.

FIG. 8A illustrates an example arrangement of pixels and metal layers in the imaging area CA of the display panel 110 according to aspects of the present disclosure. FIG. 8B is a cross-sectional view taken along with line C-C' of FIG. 8A. For convenience of description, discussions on configurations of FIGS. 8A and 8B substantially, or nearly, equal to the configurations of FIGS. 3 and 5A are not given repeatedly.

Referring to FIGS. 8A and 8B, a cathode layer can be disposed in each pixel group PG including a first pixel PIX1 and a second pixel PIX2 disposed in the imaging area CA.

A cathode disposed on the display panel 110 according to aspects of the present disclosure can be implemented in the form of multiple cathode layers. As described above, the cathode can be formed of one or more metal materials. For example, the cathode can be formed of aluminum (Al), silver (Ag), magnesium (Mg), ytterbium (Yb), or the like. One or more cathodes disposed in an area other than an area in which corresponding one or more pixels are required to emit light can decrease light transmittance of light transmitting areas AG. Therefore, by disposing the cathode in the form of divided first and second cathode layers 14-81 and 14-82, instead of disposing it in a single layer having a plate form, the light transmittance of the light-transmitting areas AG included in the imaging area CA can be improved.

The first cathode layer 14-81 can have a size that allows a corresponding pixel group PG to be covered over the pixel group PG, and have a changed size or shape according to a shape of pixel group PG. The first cathode layer 14-81 illustrated in FIG. 8A can be disposed between two light-transmitting areas AG disposed adjacent to each other in the X-axis and Y-axis directions, and be implemented in a rectangle with rounded corners.

The first cathode layer 14-81 can be implemented in a shape and/or a size that allow sub-pixels included in the pixel group PG to be covered; however, embodiments of the present disclosure are not limited to the configuration illustrated in FIG. 8A.

The first cathode layers 14-81 can be disposed to be spaced apart from one another by light transmitting areas AG interposed therebetween. The second cathode layer 14-82 can be disposed in a non-light emitting area in which two first cathode layers 14-81 adjacent to each other can be connected. Further, the second cathode layers 14-82 may not be disposed in the light transmitting areas AG. The second cathode layer 14-82 can be disposed between two adjacent light-transmitting areas AG disposed in a diagonal direction, and thus, have a rectangular shape; however, shapes of the second cathode layer 14-82 according to embodiments of the present disclosure are not limited thereto. The second cathode layer 14-82 can overlap, and be connected to, two adjacent first cathode layers 14-81 in a diagonal direction, and thus, electrically connect the first cathode layers 14-81.

The first cathode layers 14-81 may not overlap one another. Likewise, the second cathode layers 14-82 may not overlap one another. As each first cathode layer 14-81 and each second cathode layer 14-82 are alternately disposed in a diagonal direction, and the first cathode layer 14-81 and the second cathode layer 14-82 adjacent to each other in the diagonal direction are disposed to overlap, the first cathode layers 14-81 can be electrically connected through the second cathode layers 14-82.

Since the first cathode layer 14-81 covers the pixel group PG, and the second cathode layer 14-82 is required to connect the first cathode layers 14-81, the first cathode layers 14-81 and the second cathode layers 14-82 can have different shapes.

Since the imaging area CA includes light transmitting areas AG, the arrangement of the cathode (14-81, 14-82) in the imaging area CA can be implemented in a different form the arrangement of the cathode (14-61 and 14-62, or 14-71 and 14-72) of the display area DA. Accordingly, it is possible to obtain a suitable light transmittance for each area.

FIG. 8B illustrates the cross-section of the light-transmitting area AG and a green sub-pixel G. As described above, the light emitting element layer 14 can include the anode, the light emission layer, the cathode, and the common layer, and in an embodiment, as shown in FIG. 8B, an example light emitting element layer 14 can include the anode layer 14-1, the common layer 14-2, the emission layer 14-3, and a cathode layer 14-8.

The circuit layer 12 can be disposed on the substrate 10, and the anode layer 14-1 can be disposed on the circuit layer 12. Anode layers 14-1 can be disposed to be spaced apart on a sub-pixel basis. On the anode layer 14-1, the bank layer 13 can be disposed to cover an edge of the anode layer 14-1 for allowing most of the anode layer 14-1 to be exposed, and thereby, serve to separate sub-pixels.

The common layer 14-2 can be disposed on the anode layer 14-1 exposed by the bank layer 13 and the bank layer 13. Since the common layer 14-2 has high transparency, such a common layer 14-2 can be also disposed in the light transmitting areas AG. The common layer 14-2 can include a hole injection layer and a hole transport layer; however, embodiments of the present disclosure are not limited thereto.

The emission layer 14-3 can be disposed on the common layer 14-2. A green emission layer 14-31 can be disposed on the green sub-pixel G, and a first cathode layer 14-81 can be disposed on the green emission layer 14-31. Since one or more metal materials included in the first cathode layer 14-81 can decrease corresponding light transmittance, thus, the first cathode layer 14-81 may not be disposed in the light transmitting areas AG.

For example, instead of disposing the cathode layer in the form of patterned two layers, the cathode layer can be implemented such that the cathode layer is disposed on the entire surface of a certain area of the display panel 110, and then, the light transmitting areas AG are removed. In this case, the cathode layer disposed in the light transmitting area AG can be removed using a laser. At this time, powders and small pieces generated in such a process can deteriorate the characteristics of an encapsulation layer 18 to be disposed on the cathode layer and affect the reliability of the display panel 110. Accordingly, the cathode disposed on the display panel 110 according to aspects of the present disclosure can be implemented in the form of patterned first and second cathode layers 14-81 and 14-82, and thereby, the light transmittance of the light-transmitting area AG can be improved, and reliability of the display panel 110 can be enhanced.

Meanwhile, another common layer can be disposed between the green emission layer 14-31 and the first cathode layer 14-81. The second cathode layer 14-82 can be disposed on the first cathode layer 14-81. The first cathode layer 14-81 and the second cathode layer 14-82 can overlap in a non-light emitting area to be electrically conducted. In this case, the non-light emitting area can correspond to an area in which the anode layer 14-1 is not disposed.

The display panel 110 and the display device 100 including the display panel 110 according to the embodiments described herein can be described as follows. The display panel includes a first area including a plurality of first pixels, and a second area including a pixel area including a plurality of second pixels and a plurality of light-transmitting areas disposed between the plurality of second pixels. Each of the plurality of first pixels and the plurality of second pixels includes a light emitting element, such as a light emitting diode, or the like, and the light emitting element includes an anode layer and a plurality of cathode layers. The plurality of cathode layers disposed in the second area can be disposed in areas except for the light-transmitting areas. Thus, light transmittance in the light-transmitting areas can be improved, and the reliability of the display panel can be enhanced.

According to the embodiments described herein, the resolution of the plurality of second pixels disposed in the second area can be lower than the resolution of the plurality of first pixels disposed in the first area.

According to the embodiments described herein, the plurality of cathode layers can be implemented in at least two or more layers disposed in different areas and different layers.

According to the embodiments described herein, the plurality of cathode layers can be disposed in different shapes in the first area and the second area.

According to the embodiments described herein, the plurality of cathode layers can include a first cathode layer and a second cathode layer, and the second cathode layer can be implemented to overlap the first cathode layer on the first cathode layer to be electrically connected to the first cathode layer. The first cathode layer and the second cathode layer disposed in the first area can have the same shape. The first cathode layer and the second cathode layer disposed in the second area can have different shapes. The first cathode layer can be disposed to cover the second pixel on or over the second pixel, and the second cathode layer can be disposed to connect first cathode layers adjacent to each other.

According to the embodiments described herein, the plurality of cathode layers can each include two cathode layers overlapping each other, and an area where the two cathode layers overlap each other can be an area in which the anode layer is not disposed.

According to the embodiments described herein, the plurality of cathode layers can each be implemented in a metal layer.

According to the embodiments described herein, a display device includes a display panel including a first area including a plurality of first pixels, and a second area including a pixel area including a plurality of second pixels, and a plurality of light-transmitting areas disposed between the plurality of second pixels, and at least one sensor disposed under the second area. A light emitting element, such as a light emitting diode, or the like, that is included in each of the plurality of first pixels and the plurality of second pixels includes an anode layer and a plurality of cathode layers, and the plurality of cathode layers is disposed in areas except for the light-transmitting areas. Thus, light transmittance in the light-transmitting areas can be improved, and the reliability of the display device can be enhanced.

According to the embodiments described herein, the sensor can be a camera module.

According to the embodiments described herein, the plurality of cathode layers can each be implemented in a metal layer including one or more materials equal to one another.

The above description has been presented to enable any person skilled in the art to make and use the invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. Although the exemplary embodiments have been described for illustrative purposes, a person skilled in the art will appreciate that various modifications and applications are possible without departing from the essential characteristics of the present disclosure. For example, the specific components of the exemplary embodiments can be variously modified.

The above description and the accompanying drawings provide an example of the technical idea of the present invention for illustrative purposes only. For example, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure is to be construed according to the claims, and all technical ideas within the scope of the claims should be interpreted as being included in the scope of the present invention.

What is claimed is:

1. A display panel comprising:
   a first area including a plurality of first pixels; and
   a second area including a pixel area including a plurality of second pixels and a plurality of camera hole areas disposed between the plurality of second pixels, wherein each of the plurality of first pixels and the plurality of second pixels includes a light emitting element, and the light emitting element includes an anode layer and a cathode layer, wherein the cathode layer disposed in the second area includes openings, wherein a density of the first pixels is different from a density of the second pixels, wherein metal electrode materials are surrounding the openings of the cathode layer in the second area and electrically connected to a pixel group in at least one of the plurality of camera hole areas.

2. The display panel according to claim 1, further comprising:

a common layer disposed on the anode layer and a bank layer, wherein the common layer is extended to the plurality of camera hole areas.

3. The display panel according to claim 2, further comprising:

an encapsulation layer on the common layer.

4. The display panel according to claim 3, wherein an upper surface of the encapsulation layer in the plurality of camera hole areas is disposed at a level different from an upper surface of the encapsulation layer in the first area.

5. The display panel according to claim 1, wherein a resolution of the plurality of second pixels disposed in the second area is lower than a resolution of the plurality of first pixels disposed in the first area.

6. The display panel according to claim 1, wherein the plurality of cathode layers are implemented in at least two or more layers disposed in different areas.

7. The display panel according to claim 1, wherein the plurality of cathode layers are disposed in different shapes in the first area and the second area.

8. The display panel according to claim 1, wherein the second cathode layer overlaps the first cathode layer on the first cathode layer to be electrically connected to the first cathode layer.

9. The display panel according to claim 1, wherein the first cathode layer and the second cathode layer disposed in the first area have a same shape.

10. The display panel according to claim 1, wherein the first cathode layer and the second cathode layer disposed in the second area have different shapes.

11. The display panel according to claim 1, wherein each of the plurality of cathode layers includes two cathode layers overlapping each other, and an area where the two cathode layers overlap each other is an area in which the anode layer is not disposed.

12. The display panel according to claim 1, wherein each of the plurality of cathode layers is implemented in a metal layer.

13. A display device comprising:

a display panel including a first area and a second area, the first area including a plurality of first pixels, the second area including a pixel area including a plurality of second pixels and a plurality of light-transmitting areas disposed between the plurality of second pixels; and at least one sensor disposed under the second area, wherein a light emitting element included in each of the plurality of first pixels and the plurality of second pixels includes an anode layer and a plurality of cathode layers, wherein the plurality of cathode layers are disposed in areas except for the plurality of light-transmitting areas, wherein each of the plurality of cathode layers includes a first cathode layer and a second cathode layer, wherein the first cathode layer is disposed to cover a corresponding pixel among the plurality of first pixels or the plurality of second pixels, the second cathode layer does not cover the corresponding pixel, and wherein the second cathode layer is disposed to connect two adjacent first cathode layers among the plurality of cathode layers.

14. The display device according to claim 13, wherein a resolution of the plurality of second pixels disposed in the second area is lower than a resolution of the plurality of first pixels disposed in the first area.

15. The display device according to claim 13, wherein the plurality of cathode layers are disposed in different shapes in the first area and the second area.

16. The display device according to claim 13, wherein the second cathode layer overlaps the first cathode layer on the first cathode layer to be electrically connected to the first cathode layer.

17. The display device according to claim 13, wherein the first cathode layer and the second cathode layer disposed in the first area have a same shape.

18. The display device according to claim 13, wherein the first cathode layer and the second cathode layer disposed in the second area have different shapes.

19. The display device according to claim 13, wherein the at least one sensor includes a camera module.

20. The display device according to claim 13, wherein each of the plurality of cathode layers includes two cathode layers overlapping each other, and an area where the two cathode layers overlap each other is an area in which the anode layer is not disposed.

21. The display device according to claim 13, wherein the plurality of cathode layers are implemented as metal layers including a same material.

* * * * *